(12) United States Patent
Subbannavar et al.

(10) Patent No.: US 11,626,879 B2
(45) Date of Patent: Apr. 11, 2023

(54) INTEGRATED CIRCUIT INCLUDING A COMBINED LOGIC CELL

(71) Applicant: TEXAS INSTRUMENTS INCORPORATED, Dallas, TX (US)

(72) Inventors: Badarish Mohan Subbannavar, Bangalore (IN); Rakesh Dimri, Karnataka (IN); Somasekar J, Bangalore (IN); Mohammad Asif Farooqui, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/463,115

(22) Filed: Aug. 31, 2021

(65) Prior Publication Data

US 2023/0061062 A1 Mar. 2, 2023

(51) Int. Cl.
*H03K 19/08* (2006.01)
(52) U.S. Cl.
CPC .................................... *H03K 19/08* (2013.01)
(58) Field of Classification Search
None
See application file for complete search history.

(56) References Cited

U.S. PATENT DOCUMENTS

| 2005/0044522 | A1* | 2/2005 | Maeda | H01L 27/11803 430/5 |
| 2017/0116365 | A1* | 4/2017 | Cheng | G06F 30/39 |
| 2020/0279812 | A1* | 9/2020 | Biswas | H01L 23/528 |

\* cited by examiner

*Primary Examiner* — Jany Richardson
(74) *Attorney, Agent, or Firm* — Andrew R. Ralston; Frank D. Cimino

(57) ABSTRACT

An integrated circuit, and method of forming the same. The integrated circuit includes standard logic cells and a combined logic cell over a semiconductor substrate. Each standard logic cell includes a standard height, a width that is an integer multiple of a unit width, first and second power rails, and at least one transistor and interconnections configured to implement a logic function that produces a single logic output. The combined logic cell includes the standard height, a width that is an integer multiple of the unit width, the first and second power rails, and at least two transistors and interconnections configured to implement a first logic function and a second logic function. The first and second logic functions produce first and second logic outputs, respectively. The interconnections are configured to direct the first logic output and the second logic output to destinations outside the combined logic cell.

20 Claims, 6 Drawing Sheets

INTEGRATED CIRCUIT INCLUDING A COMBINED LOGIC CELL

TECHNICAL FIELD

The present disclosure is directed, in general, to integrated circuits and, more specifically, to an integrated circuit including a combined logic cell, and method of operating and forming the same.

BACKGROUND

Logic cells include transistors configured to perform logic functions such as, without limitation, inverters, NAND gates and NOR gates. The transistors of standard logic cells perform the logic functions at an output drive current capacity. The standard logic cells in a digital library perform a single logic function within a standard height and varying widths.

There are also logic cells that perform logic functions at lower power levels (also referred to a "low-drive logic cells"). The transistors of low-drive standard logic cells perform the logic functions at a lower output drive current capacity. The low-drive standard logic cells in a digital library also perform a single function within a standard height and varying widths. The low-drive standard logic cells may provide, without limitation, a quarter or half of the output drive current capacity of the standard logic cells.

Due to the reduction in power levels, the transistors of low-drive standard logic cells have smaller feature sizes (e.g., smaller transistor widths) than the corresponding transistors of the standard logic cells at higher power levels. As a result of the standard (fixed) heights for the standard logic cells, the low-drive standard logic cells typically have additional unused space compared to the corresponding standard logic cells with higher output drive current capacity.

Stated another way, the low-drive standard logic cells are particularly designed to consume lower power. The majority of the low-drive standard logic cells, however, have the same or similar area as the standard logic cells at higher power levels due to having the same cell width determined by front-end layout rules and pitch. Hence, there is usually only a power gain with the low-drive standard logic cells, but not an area gain. Thus, the low-drive standard logic cells often experience inefficient utilization of semiconductor die (also referred to as "die") area.

Accordingly, what is needed is an integrated circuit and complementary method of forming the same that includes logic cells for performing logic functions that efficiently utilize die area within the constraints of the standard (fixed) height associated therewith.

SUMMARY OF THE DISCLOSURE

These and other problems are generally solved or circumvented, and technical advantages are generally achieved, by advantageous examples of the present disclosure which includes an integrated circuit, and method of forming the same. In one example, the integrated circuit includes a plurality of logic cells arranged over a semiconductor substrate in rows including standard logic cells and at least one combined logic cell. Each standard logic cell includes a standard height, a width that is an integer multiple of a unit width, a first power rail along one side, a second power rail along a second opposite side, and at least one transistor and interconnections configured to implement a logic function that when operated produces a single logic output of that standard logic cell. The combined logic cell includes the standard height, a width that is an integer multiple of the unit width, the first power rail along one side, the second power rail along a second opposite side, and at least two transistors and interconnections configured to implement a first logic function and a second logic function. The first logic function and the second logic function produce a first logic output and a second logic output, respectively. The interconnections are configured to direct the first logic output and the second logic output to respective destinations outside the combined logic cell.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated that the specific examples disclosed may be readily utilized as a basis for modifying or designing other structures or processes for carrying out the same purposes of the present disclosure. It should also be realized that such equivalent constructions do not depart from the spirit and scope of the disclosure as set forth in the appended claims.

BRIEF DESCRIPTION OF THE DRAWINGS

For a more complete understanding of the present disclosure, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred examples and are not necessarily drawn to scale.

DETAILED DESCRIPTION

The making and using of the examples are discussed in detail below. It should be appreciated, however, that the present disclosure provides many applicable concepts that can be embodied in a wide variety of specific contexts. The specific examples discussed are merely illustrative of specific ways to make and use the disclosure, and do not limit the scope of the disclosure.

The present disclosure will be described with respect to examples in a specific context, namely, an integrated circuit, and method of operating and forming the same. The principles of the present disclosure, however, may also be applied to all types of circuits that may benefit from a combined logic cell that implements a plurality of logic functions within the constraints of standard (fixed) height for standard logic cells. As mentioned above, the low-drive standard logic cells often experience inefficient utilization of semiconductor die (also referred to as "die") area.

Various examples described herein include first and second power rails situated at opposite sides of a logic cell. One power rail, e.g., the first power rail, may provide a first voltage potential such as Vdd, while the second power rail may provide a second voltage potential such as Vss, or ground. Throughout this description and the FIGUREs, the first power rail is shown at the top of a corresponding logic cell, while he second power rail is shown at the bottom of the corresponding logic cell. This convention is merely for convenience of discussion, and those skilled in the pertinent art will appreciate that the ordering of the power rails may be reversed. Further, As used herein, the term "gate length" refers to the extent of a gate electrode in a direction of current flow through a transistor channel, while "gate width" refers to the extent of the gate electrode in a direction normal to the gate length. A switching speed of a transistor is determined in part by the gate length, and a drive current capability of the transistor is determined in part by the gate width.

Figure 1:
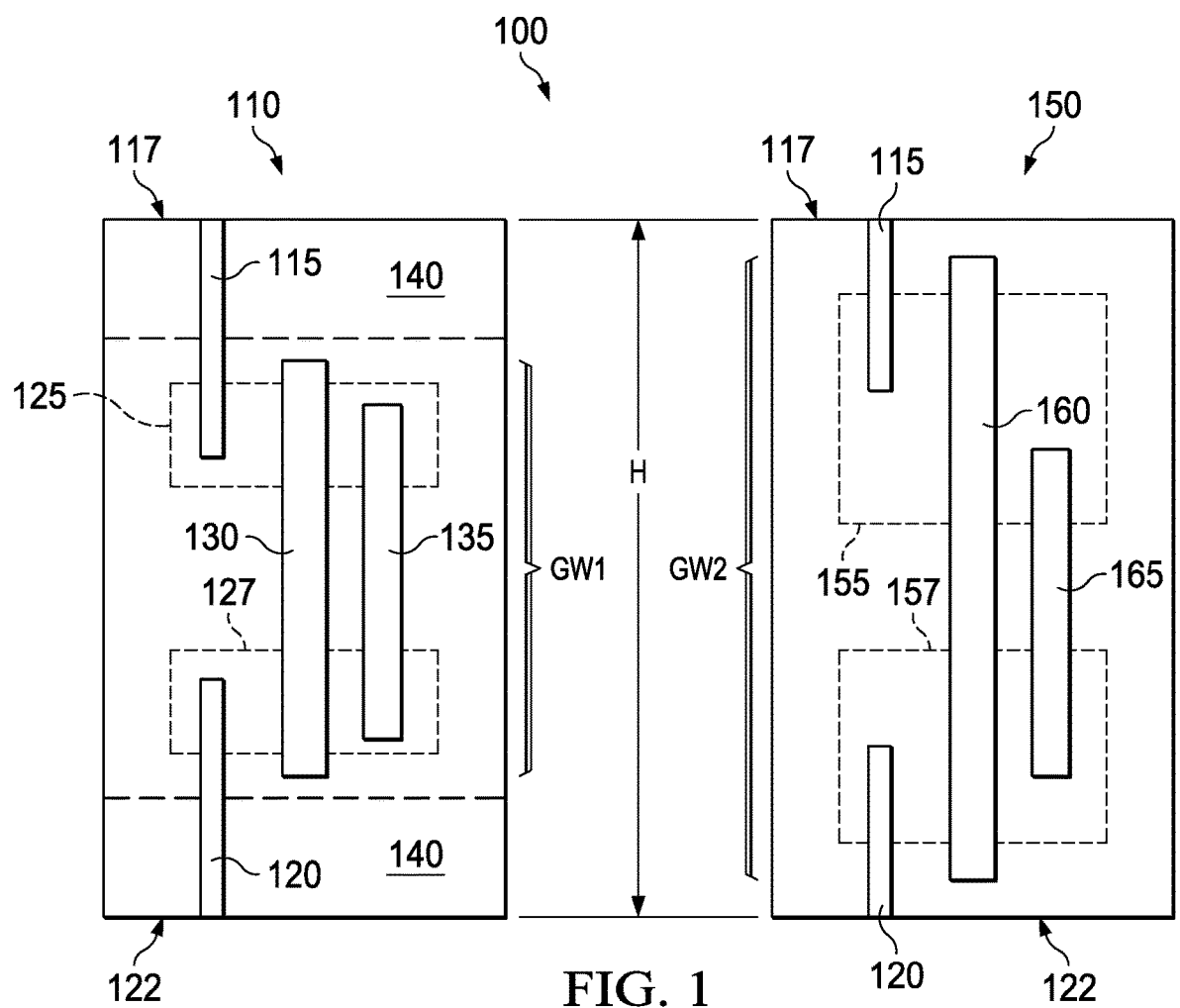
FIG. 1 illustrates a plan view of an example of an integrated circuit.

Referring initially to FIG. 1, illustrated is a plan view of an example of an integrated circuit 100. The integrated circuit 100 includes a low-drive standard logic cell 110 and a standard logic cell 150 at a higher power level. The low-drive standard logic cell 110 represents 0.5× (or fifty percent) of the output drive current capacity of the standard logic cell 150. The low-drive standard logic cell 110 includes a first power rail 115 along one side 117, and a second power rail 120 along a second opposite side 122. The low-drive standard logic cell 110 includes a first transistor source-drain region 125, and a second transistor source-drain region 127. The low-drive standard logic cell 110 includes a gate region 130 (with a gate width GW1) that provides the logic input(s) to the low-drive standard logic cell 110, and a logic output 135. The low-drive standard logic cell 110 includes a standard height designated "H".

The gate region 130 is illustrated as a single structure that spans and includes a gate over the first transistor source-drain region 125, and a gate over the second transistor source-drain region 127. Similarly, the gate width GW1 is also illustrated as a single overall dimension of the gate region 130 that includes a gate width for the gate over the first transistor source-drain region 125, and a gate width for the gate over the second transistor source-drain region 127.

The standard logic cell 150 includes the first power rail 115 along one side 117, and the second power rail 120 along the second opposite side 122. The standard logic cell 150 includes a first transistor source-drain region 155, and a second transistor source-drain region 157. The standard logic cell 150 includes a gate region 160 (with a gate width GW2) that provides the logic input(s) to the standard logic cell 150, and a logic output 165. The standard logic cell 150 includes the standard height designated "H".

The gate region 160 is illustrated as a single structure that spans and includes a gate over the first transistor source-drain region 155, and a gate over the second transistor source-drain region 157. The gate width GW2 is also illustrated as a single overall dimension of the gate region 160 that includes a gate width for the gate over the first transistor source-drain region 155, and a gate width for the gate over the second transistor source-drain region 157.

Due to the smaller transistor feature sizes and standard height, the low-drive standard logic cell 110 has unused semiconductor die area 140. For instance, the first transistor source-drain region 125 and the second transistor source-drain region 127 of the low-drive standard logic cell 110 are smaller (smaller area) than the first transistor source-drain region 155 and the second transistor source-drain region 157 of the standard logic cell 150.

Figure 2:
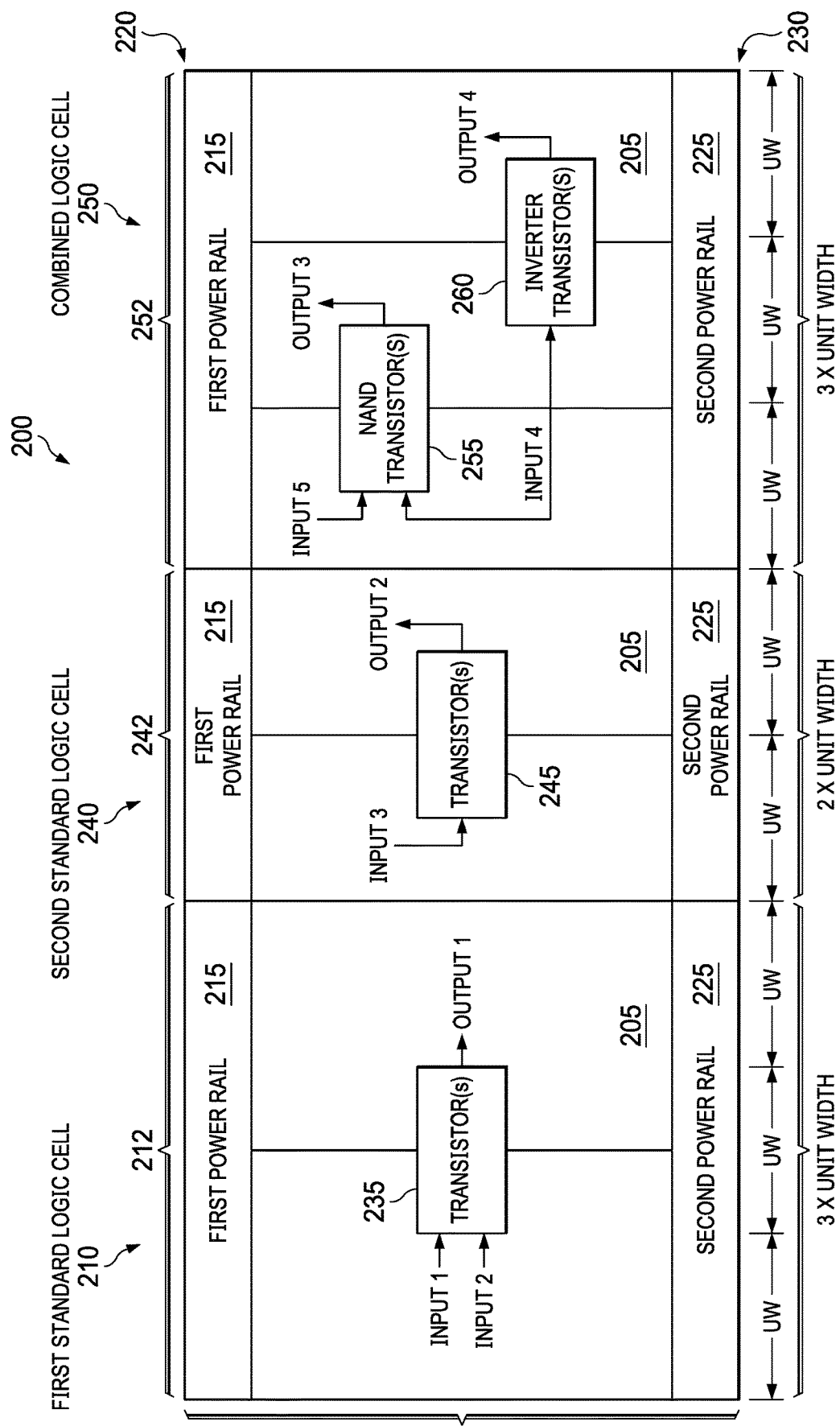
FIGS. 2 and 3 illustrate block diagrams of examples of an integrated circuit.

Turning now to FIG. 2, illustrated is a block diagram of an example of an integrated circuit 200. The integrated circuit 200 includes a plurality of logic cells including standard logic cells (e.g., a first standard logic cell 210 and a second standard logic cell 240) and at least one combined logic cell (e.g., a combined logic cell 250) arranged over a semiconductor substrate 205 in rows. The first standard logic cell 210 uses a first die area 212 and includes a standard height (designated "H"), and a width that is an integer multiple of a unit width (designated "UW"). In this example, the width of the first standard logic cell 210 is three times the unit width (or three integer units wide, e.g., about 1.56 microns). Also note that the die area in general is the height multiplied by the width of the respective cell. The first standard logic cell 210 also includes a first power rail 215 along one side 220, and a second power rail 225 along a second opposite side 230. The first standard logic cell 210 also includes at least one transistor 235 and interconnections configured to implement a logic function (e.g., a two-input NAND gate) that when operated produces a single logic output OUTPUT 1 of the first standard logic cell 210 from a first input INPUT 1 and a second input INPUT 2 to the first standard logic cell 210.

The second standard logic cell 240 uses a second die area 242 and includes the standard height (designated "H"), and a width that is an integer multiple of a unit width (designated "UW"). In this example, the width of the second standard logic cell 240 is two times the unit width (or two integer units wide, e.g., about 1.04 microns). The second standard logic cell 240 also includes the first power rail 215 along the one side 220, and the second power rail 225 along the second opposite side 230. The second standard logic cell 240 also includes at least one transistor 245 and interconnections configured to implement a logic function (e.g., an inverter) that when operated produces a single logic output OUTPUT 2 of the second standard logic cell 240 from an input to the second standard logic cell 240 (in this example, a third input INPUT 3 for the integrated circuit 200).

The combined logic cell 250 uses a third die area 252 and includes the standard height (designated "H"), and a width that is an integer multiple of a unit width (designated "UW"). In this example, the width of the combined logic cell 250 is three times the unit width (or three integer units wide, e.g., about 1.56 microns), and the third die area 252 is about sixty percent or less than the sum of the first and second die areas 212, 242. The combined logic cell 250 also includes the first power rail 215 along the one side 220, and the second power rail 225 along the second opposite side 230. The combined logic cell 250 also includes at least two transistors (e.g., first (NAND) transistors 255 and second (inverter) transistors 260) and interconnections configured to implement a first logic function (e.g., a two-input NAND gate) and a second logic function (e.g., an inverter). In this example, the first logic function is a different logic function than the second logic function. The first logic function produces a first logic output OUTPUT 3 of the combined logic cell 250 from a first input to the combined logic cell 250 (in this example, a fourth input INPUT 4 for the integrated circuit 200) and a second input to the combined logic cell 250 (in this example, a fifth input INPUT 5 for the integrated circuit 200). The second logic function produces a second logic output OUTPUT 4 of the combined logic cell 250 from the first input to the combined logic cell 250 (again, the fourth input INPUT 4 for the integrated circuit 200). Thus, the first logic output OUTPUT 3 and the second logic output OUTPUT 4 are respective first and second functions of a same logic input (e.g., the fourth input INPUT 4 for the integrated circuit 200) to the combined logic cell 250. The interconnections are configured to direct the first logic output OUTPUT 3 and the second logic output OUTPUT 4 to respective destinations outside the combined logic cell 250.

The first (NAND) transistors 255 are configured to produce the first logic output OUTPUT 3 with a first output drive current capacity, and the second (inverter) transistors 260 are configured to produce the second logic output OUTPUT 4 with a second output drive current capacity different than the first output drive capacity. The at least two transistors 255, 260 (or ones thereof) of the combined logic cell 250 may have a same or lower output drive current capacity than the at least one transistor 235, 245 of the first and second standard logic cells 210, 240, respectively, of the plurality of standard logic cells. The at least one transistor 235, 245 of each standard logic cell 210, 240 of the plurality of standard logic cells have first and second gate widths, respectively, and the at least two transistors 255, 260 of the combined logic cell 250 configured to implement the corresponding first and second logic functions have third and fourth gate widths, respectively. At least one of the third and fourth gate widths is different than at least one of the first and second gate widths. The first and second gate widths may be substantially equal, and at least one of the third and fourth gate widths are different than the first and second gate widths. While the gate widths in general may be the same or different, the cell height for the combined logic cell 250 and the first and second standard logic cell 210, 240 is the same while accommodating multiple logic functions.

Figure 3:
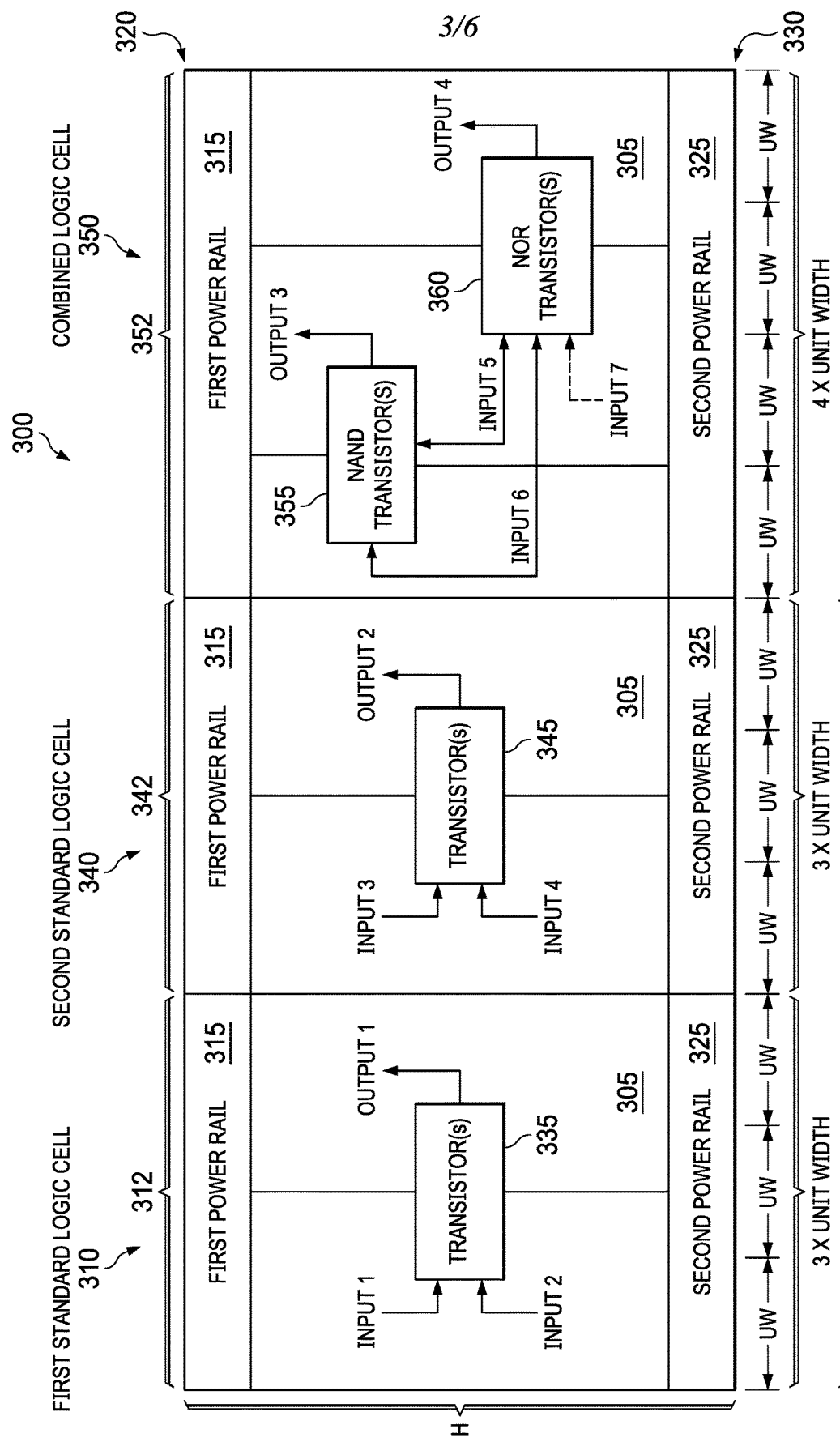

Turning now to FIG. 3, illustrated is a block diagram of an example of an integrated circuit 300. The integrated circuit 300 includes a plurality of logic cells including standard logic cells (e.g., a first standard logic cell 310 and a second standard logic cell 340) and at least one combined logic cell (e.g., a combined logic cell 350) arranged over a semiconductor substrate 305 in rows. The first standard logic cell 310 uses a first die area 312 and includes a standard height (designated "H"), and a width that is an integer multiple of a unit width (designated "UW"). In this example, the width of the first standard logic cell 310 is three times the unit width (or three integer units wide, e.g., about 1.56 microns). Also note that the die area in general is the height multiplied by the width of the respective cell. The first standard logic cell 310 also includes a first power rail 315 along one side 320, and a second power rail 325 along a second opposite side 330. The first standard logic cell 310 also includes at least one transistor 335 and interconnections configured to implement a logic function (e.g., a two-input NAND gate) that when operated produces a single logic output OUTPUT 1 of the first standard logic cell 310 from a first input INPUT 1 and a second input INPUT 2 to the first standard logic cell 310.

The second standard logic cell 340 uses a second die area 342 and includes the standard height (designated "H"), and a width that is an integer multiple of a unit width (designated "UW"). In this example, the width of the second standard logic cell 340 is three times the unit width (or three integer units wide, e.g., about 1.56 microns). The second standard logic cell 340 also includes the first power rail 315 along the one side 320, and the second power rail 325 along the second opposite side 330. The second standard logic cell 340 also includes at least one transistor 345 and interconnections configured to implement a logic function (e.g., a two-input NOR gate) that when operated produces a single logic output OUTPUT 2 of the second standard logic cell 340 from a first input to the second standard logic cell 340 (in this example, a third input INPUT 3 for the integrated circuit 300) and a second input to the second standard logic cell 340 (in this example, a fourth input INPUT 4 for the integrated circuit 300).

The combined logic cell 350 uses a third die area 352 and includes the standard height (designated "H"), and a width that is an integer multiple of a unit width (designated "UW"). In this example, the width of the combined logic cell 350 is four times the unit width (or four integer units wide, e.g., about 2.08 microns), and the third die area 352 is about seventy percent or less than the sum of the first and second die areas 312, 342. The combined logic cell 350 also includes the first power rail 315 along the one side 320, and the second power rail 325 along the second opposite side 330. The combined logic cell 350 also includes at least two transistors (e.g., first (NAND) transistors 355 and second (NOR) transistors 360) and interconnections configured to implement a first logic function (e.g., a two-input NAND gate) and a second logic function (e.g., a two-input NOR gate). In this example, the first logic function is a different logic function than the second logic function. The first logic function produces a first logic output OUTPUT 3 of the combined logic cell 350 from a first input to the combined logic cell 350 (in this example, a fifth input INPUT 5 for the integrated circuit 300) and a second input to the combined logic cell 350 (in this example, a sixth input INPUT 6 for the integrated circuit 300). The second logic function produces a second logic output OUTPUT 4 of the combined logic cell 350 from the first input to the combined logic cell 350 (again, the fifth input INPUT 5 for the integrated circuit 300) and the second input to the combined logic cell 350 (again, the sixth input INPUT 6 for the integrated circuit 300). Thus, the first logic output OUTPUT 3 and the second logic output OUTPUT 4 are respective first and second functions of the same logic inputs (e.g., the fifth input INPUT 5 and the sixth input INPUT 6 for the integrated circuit 300) to the combined logic cell 350. It should be understood that either one of the first and second functions may employ a different logic input (e.g., a third input to the combined logic cell 350 and, in this example, a seventh input INPUT 7 for the integrated circuit 300) as opposed to shared inputs. The interconnections are configured to direct the first logic output OUTPUT 3 and the second logic output OUTPUT 4 to respective destinations outside the combined logic cell 350.

The first (NAND) transistors 355 are configured to produce the first logic output OUTPUT 3 with a first output drive current capacity, and the second (NOR) transistors 360 are configured to produce the second logic output OUTPUT 4 with a second output drive current capacity different than the first output drive capacity. The at least two transistors 355, 360 of the combined logic cell 350 may have a same or lower output drive current capacity than the at least one transistor 335, 345 of the first and second standard logic cells 310, 340, respectively, of the plurality of standard logic cells. The at least one transistor 335, 345 of each standard logic cell 310, 340 of the plurality of standard logic cells have first and second gate widths, respectively, and the at least two transistors 355, 360 of the combined logic cell 350 configured to implement the corresponding first and second logic functions have third and fourth gate widths, respectively. At least one of the third and fourth gate widths is different than at least one of the first and second gate widths. The first and second gate widths may be substantially equal, and at least one of the third and fourth gate widths are different than the first and second gate widths. While the gate widths in general may be the same or different, the cell height for the combined logic cell 350 and the first and second standard logic cell 310, 340 is the same while accommodating multiple logic functions.

Figure 4:
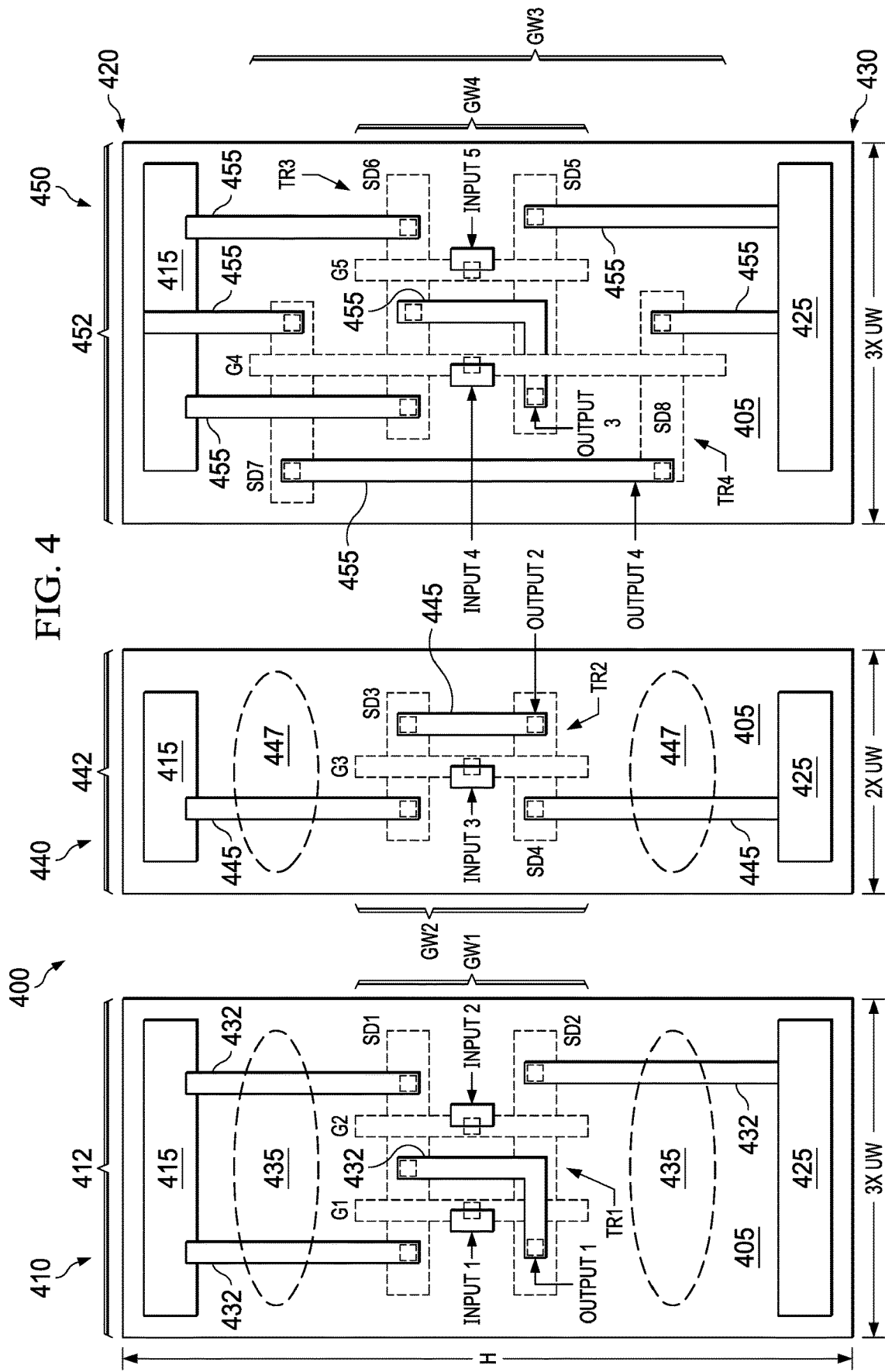
FIGS. 4 and 5 illustrate plan views of examples of an integrated circuit.

Turning now to FIG. 4, illustrated is a plan view of an example of an integrated circuit 400. The integrated circuit 400 includes a plurality of logic cells including standard logic cells (e.g., a first standard logic cell 410 and a second standard logic cell 440) and at least one combined logic cell (e.g., a combined logic cell 450) arranged over a semiconductor substrate 405 in rows. The first standard logic cell 410 uses a first die area 412 and includes a standard height (designated "H"), and a width that is an integer multiple of a unit width (designated "UW"). In this example, the width of the first standard logic cell 410 is three times the unit width (or three integer units wide, e.g., about 1.56 microns). Also note that the die area in general is the height multiplied by the width of the respective cell. The first standard logic cell 410 also includes a first power rail 415 along one side 420, and a second power rail 425 along a second opposite side 430. The first standard logic cell 410 also includes at least one transistor (e.g., NAND transistors generally designated TR1) and interconnections configured to implement a logic function (e.g., a two-input NAND gate) that when operated produces a single logic output OUTPUT 1 of the first standard logic cell 410 from a first input INPUT 1 and a second input INPUT 2 to the first standard logic cell 410.

The NAND transistors TR1 include first and second transistors of the first standard logic cell 410. The first transistor includes a gate region G1 (with a gate width GW1), a first transistor source-drain region SD1, and the interconnections (some of which are designated 432) configured to implement the logic function. The second transistor includes a gate region G2 (with a gate width GW1), a second transistor source-drain region SD2, and the interconnections (some of which are designated 432) configured to implement the logic function. As illustrated, the first standard logic cell 410 includes unused semiconductor die area 435, representing inefficient utilization of semiconductor die area.

While the gate region G1 is illustrated as a single structure that spans the first transistor source-drain region SD1 and the second transistor source-drain region SD2, the gate region G1 includes a gate over the first transistor source-drain region SD1. Similarly, the gate width GW1 is also illustrated as a single overall dimension of the gate region G1 that includes a gate width for the gate over the first transistor source-drain region SD1.

While the gate region G2 is illustrated as a single structure that spans the first transistor source-drain region SD1 and the second transistor source-drain region SD2, the gate region G2 includes a gate over the second transistor source-drain region SD2. Similarly, the gate width GW1 is also illustrated as a single overall dimension of the gate region G2 that includes a gate width for the gate over the second transistor source-drain region SD2.

The second standard logic cell 440 uses a second die area 442 and includes the standard height (designated "H"), and a width that is an integer multiple of a unit width (designated "UW"). In this example, the width of the second standard logic cell 440 is two times the unit width (or two integer units wide, e.g., about 1.04 microns). The second standard logic cell 440 also includes the first power rail 415 along the one side 420, and the second power rail 425 along the second opposite side 430. The second standard logic cell 440 also includes at least one transistor (e.g., inverter transistors generally designated TR2) and interconnections configured to implement a logic function (e.g., an inverter) that when operated produces a single logic output OUTPUT 2 of the second standard logic cell 440 from an input to the second standard logic cell 440 (in this example, a third input INPUT 3 for the integrated circuit 400).

The inverter transistors TR2 include first and second transistors of the second standard logic cell 440. The first transistor (in this example, a third transistor for the integrated circuit 400) includes a gate region G3 (with a gate width GW2), a first transistor source-drain region (in this example, a third transistor source-drain region SD3 for the integrated circuit 400), and the interconnections (some of which are designated 445) configured to implement the logic function. The second transistor (in this example, a fourth transistor for the integrated circuit 400) includes the gate region G3 (with a gate width GW2), a second transistor source-drain region (in this example, a fourth transistor source-drain region SD4 for the integrated circuit 400), and the interconnections (some of which are designated 445) configured to implement the logic function. As illustrated, the standard logic cell 440 includes unused semiconductor die area 447, representing inefficient utilization of semiconductor die area.

The gate region G3 is illustrated as a single structure that spans and includes a gate over the third transistor source-drain region SD3, and a gate over the fourth transistor source-drain region SD4. The gate width GW2 is also illustrated as a single overall dimension of the gate region G3 that includes a gate width for the gate over the third transistor source-drain region SD3, and a gate width for the gate over the fourth transistor source-drain region SD4.

The combined logic cell 450 uses a third die area 452 and includes the standard height (designated "H"), and a width that is an integer multiple of a unit width (designated "UW"). In this example, the width of the combined logic cell 450 is three times the unit width (or three integer units wide, e.g., about 1.56 microns), and the third die area 452 is about sixty percent or less than the sum of the first and second die areas 412, 442. The combined logic cell 450 also includes the first power rail 415 along the one side 420, and the second power rail 425 along the second opposite side 430. The combined logic cell 450 also at least two transistors (e.g., first (NAND) transistors generally designated TR3 and second (inverter) transistors generally designated TR4) and interconnections configured to implement a first logic function (e.g., a two-input NAND gate) and a second logic function (e.g., an inverter). In this example, the first logic function is a different logic function than the second logic function. The first logic function produces a first logic output OUTPUT 3 of the combined logic cell 450 from a first input to the combined logic cell 450 (in this example, a fourth input INPUT 4 for the integrated circuit 400) and a second input to the combined logic cell 450 (in this example, a fifth input INPUT 5 for the integrated circuit 400). The second logic function produces a second logic output OUTPUT 4 of the combined logic cell 450 from the first input to the combined logic cell 450 (again, the fourth input INPUT 4 for the integrated circuit 400). Thus, the first logic output OUTPUT 3 and the second logic output OUTPUT 4 are respective first and second functions of a same logic input (e.g., the fourth input INPUT 4 for the integrated circuit 400) to the combined logic cell 450. The interconnections are configured to direct the first logic output OUTPUT 3 and the second logic output OUTPUT 4 to respective destinations outside the combined logic cell 450.

The first (NAND) transistors TR3 include first and second transistors of the combined logic cell 450. The first transistor (in this example, a fifth transistor for the integrated circuit 400) of the combined logic cell 450 includes a gate region G4 (with a gate width GW3), a first transistor source-drain region (in this example, a fifth transistor source-drain region SD5 for the integrated circuit 400), and the interconnections (some of which are designated 455) configured to implement the logic function. The second transistor (in this example, a sixth transistor for the integrated circuit 400) includes the gate region G5 (with a gate width GW4), a second transistor source-drain region (in this example, a sixth transistor source-drain region SD6 for the integrated circuit 400), and the interconnections (some of which are designated 455) configured to implement the logic function.

The second (INVERTER) transistors TR4 include third and fourth transistors of the combined logic cell 450. The third transistor (in this example, a seventh transistor for the integrated circuit 400) of the combined logic cell 450 includes the gate region G4 (with the gate width GW3), a third transistor source-drain region (in this example, a seventh transistor source-drain region SD7 for the integrated circuit 400), and the interconnections (some of which are designated 455) configured to implement the logic function. The fourth transistor (in this example, an eighth transistor for the integrated circuit 400) includes the gate region G4 (with a gate width GW3), a fourth transistor source-drain region (in this example, an eighth transistor source-drain region SD8 for the integrated circuit 400), and the interconnections (some of which are designated 455) configured to implement the logic function.

While the gate region G4 is illustrated as a single structure that spans the fifth transistor source-drain region SD5, the sixth transistor source-drain region SD6, the seventh transistor source-drain region SD7 and the eighth transistor source-drain region SD8, the gate region G4 includes a gate over the fifth transistor source-drain region SD5, a gate over the seventh transistor source-drain region SD7 and a gate over the eighth transistor source-drain region SD8. Similarly, the gate width GW3 is also illustrated as a single overall dimension of the gate region G4 that includes a gate width for the gate over the fifth transistor source-drain region SD5, a gate width for the gate over the seventh transistor source-drain region SD7 and a gate width for the gate over the eighth transistor source-drain region SD8.

While the gate region G5 is illustrated as a single structure that spans the fifth transistor source-drain region SD5 and the sixth transistor source-drain region SD6, the gate region G5 includes a gate over the sixth transistor source-drain region SD6. Similarly, the gate width GW4 is also illustrated as a single overall dimension of the gate region G5 that includes a gate width for the gate over the sixth transistor source-drain region SD6.

The first (NAND) transistors TR3 (in this example, the fifth and sixth transistors for the integrated circuit 400) are configured to produce the first logic output OUTPUT 3 with a first output drive current capacity, and the second (inverter) transistors TR4 (in this example, the seventh and eighth transistors for the integrated circuit 400) are configured to produce the second logic output OUTPUT 4 with a second output drive current capacity different than the first output drive capacity. The transistors (in this example, the fifth, sixth, seventh and eighth transistors for the integrated circuit 400, or ones thereof) of the combined logic cell 450 may have a same or lower output drive current capacity than the transistors (in this example, the first, second, third and fourth transistors for the integrated circuit 400) of the first and second standard logic cells 410, 440 of the plurality of standard logic cells. The transistors of each standard logic cell 410, 440 of the plurality of standard logic cells have first and second gate widths (in this example, the gate width GW1 for the first and second transistors for the integrated circuit 400, and the gate width GW2 for the third and fourth transistors for the integrated circuit 400). The transistors of the combined logic cell 450 configured to implement the corresponding first and second logic functions have third and fourth gate widths (in this case, the gate width GW3 for the fifth, seventh and eighth transistors for the integrated circuit 400, and the gate width GW4 for the sixth transistor for the integrated circuit 400). At least one of the third and fourth gate widths GW3, GW4 is different than at least one of the first and second gate widths GW1, GW2. The first and second gate widths GW1, GW2 may be substantially equal, and at least one of the third and fourth gate widths GW3, GW4 are different than the first and second gate widths GW1, GW2. While the gate widths in general may be the same or different, the cell height for the combined logic cell 450 and the first and second standard logic cell 410, 440 is the same while accommodating multiple logic functions.

Figure 5:
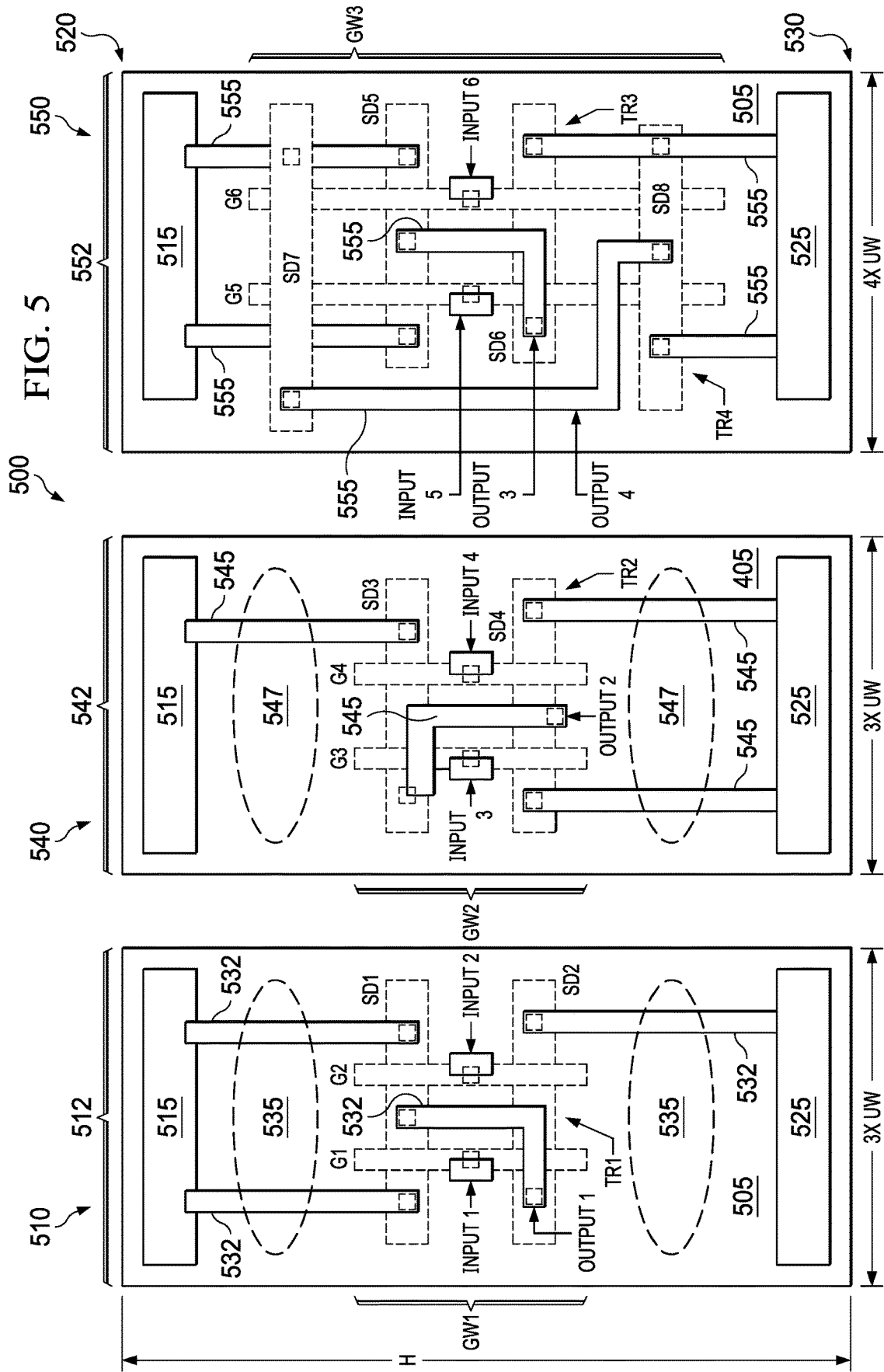

Turning now to FIG. 5, illustrated is a plan view of an example of an integrated circuit 500. The integrated circuit 500 includes a plurality of logic cells including standard logic cells (e.g., a first standard logic cell 510 and a second standard logic cell 540) and at least one combined logic cell (e.g., a combined logic cell 550) arranged over a semiconductor substrate 505 in rows. The first standard logic cell 510 uses a first die area 512 and includes a standard height (designated "H"), and a width that is an integer multiple of a unit width (designated "UW"). In this example, the width of the first standard logic cell 510 is three times the unit width (or three integer units wide, e.g., about 1.56 microns). Also note that the die area in general is the height multiplied by the width of the respective cell. The first standard logic cell 510 also includes a first power rail 515 along one side 520, and a second power rail 525 along a second opposite side 530. The first standard logic cell 510 also includes at least one transistor (e.g., NAND transistors generally designated TR1) and interconnections configured to implement a logic function (e.g., a two-input NAND gate) that when operated produces a single logic output OUTPUT 1 of the first standard logic cell 510 from a first input INPUT 1 and a second input INPUT 2 to the first standard logic cell 510.

The NAND transistors TR1 include first and second transistors of the first standard logic cell 510. The first transistor includes a gate region G1 (with a gate width GW1), a first transistor source-drain region SD1, and the interconnections (some of which are designated 532) configured to implement the logic function. The second transistor includes a gate region G2 (with a gate width GW1), a second transistor source-drain region SD2, and the interconnections (some of which are designated 532) configured to implement the logic function. As illustrated, the first standard logic cell 510 includes unused semiconductor die area 535, representing inefficient utilization of semiconductor die area.

While the gate region G1 is illustrated as a single structure that spans the first transistor source-drain region SD1 and the second transistor source-drain region SD2, the gate region G1 includes a gate over the first transistor source-drain region SD1. Similarly, the gate width GW1 is also illustrated as a single overall dimension of the gate region G1 that includes a gate width for the gate over the first transistor source-drain region SD1.

While the gate region G2 is illustrated as a single structure that spans the first transistor source-drain region SD1 and the second transistor source-drain region SD2, the gate region G2 includes a gate over the second transistor source-drain region SD2. Similarly, the gate width GW1 is also illustrated as a single overall dimension of the gate region G2 that includes a gate width for the gate over the second transistor source-drain region SD2.

The second standard logic cell 540 uses a second die area 542 and includes the standard height (designated "H"), and a width that is an integer multiple of a unit width (designated "UW"). In this example, the width of the second standard logic cell 540 is three times the unit width (or three integer units wide, e.g., about 1.56 microns). The second standard logic cell 540 also includes the first power rail 515 along the one side 520, and the second power rail 525 along the second opposite side 530. The second standard logic cell 540 also includes at least one transistor (e.g., NOR transistors generally designated TR2) and interconnections configured to implement a logic function (e.g., two-input NOR gate) that when operated produces a single logic output OUTPUT 2 of the second standard logic cell 540 from a first input to the second standard logic cell 540 (in this example, a third input INPUT 3 for the integrated circuit 500) and a second input to the second standard logic cell 540 (in this example, a fourth input INPUT 4 for the integrated circuit 500).

The NOR transistors TR2 include first and second transistors of the second standard logic cell 540. The first transistor (in this example, a third transistor for the integrated circuit 500) includes a gate region G3 (with a gate width GW2), a first transistor source-drain region (in this example, a third transistor source-drain region SD3 for the integrated circuit 500), and the interconnections (some of which are designated 545) configured to implement the logic function. The second transistor (in this example, a fourth transistor for the integrated circuit 500) includes the gate region G4 (with a gate width GW2), a second transistor source-drain region (in this example, a fourth transistor source-drain region SD4 for the integrated circuit 500), and the interconnections (some of which are designated 545) configured to implement the logic function. As illustrated, the standard logic cell 540 includes unused semiconductor die area 547, representing inefficient utilization of semiconductor die area.

While the gate region G3 is illustrated as a single structure that spans the third transistor source-drain region SD3 and the fourth transistor source-drain region SD4, the gate region G3 includes a gate over the third transistor source-drain region SD3. Similarly, the gate width GW2 is also illustrated as a single overall dimension of the gate region G3 that includes a gate width for the gate over the third transistor source-drain region SD3.

While the gate region G4 is illustrated as a single structure that spans the third transistor source-drain region SD3 and the fourth transistor source-drain region SD4, the gate region G4 includes a gate over the fourth transistor source-drain region SD4. Similarly, the gate width GW2 is also illustrated as a single overall dimension of the gate region G4 that includes a gate width for the gate over the fourth transistor source-drain region SD4.

The combined logic cell 550 uses a third die area 552 and includes the standard height (designated "H"), and a width that is an integer multiple of a unit width (designated "UW"). In this example, the width of the combined logic cell 550 is four times the unit width (or four integer units wide, e.g., about 2.08 microns), and the third die area 552 is about seventy percent or less than the sum of the first and second die areas 512, 542. The combined logic cell 550 also includes the first power rail 515 along the one side 520, and the second power rail 525 along the second opposite side 530. The combined logic cell 550 also at least two transistors (e.g., first (NAND) transistors generally designated TR3 and second (NOR) transistors generally designated TR4) and interconnections configured to implement a first logic function (e.g., a two-input NAND gate) and a second logic function (e.g., a two-input NOR gate). In this example, the first logic function is a different logic function than the second logic function. The first logic function produces a first logic output OUTPUT 3 of the combined logic cell 550 from a first input to the combined logic cell 550 (in this example, a fifth input INPUT 5 for the integrated circuit 500) and a second input to the combined logic cell 550 (in this example, a sixth input INPUT 5 for the integrated circuit 500). The second logic function produces a second logic output OUTPUT 4 of the combined logic cell 550 from the first input to the combined logic cell 550 (again, the fifth input INPUT 5 for the integrated circuit 500) and the second input to the combined logic cell 550 (again, the sixth input INPUT 6 for the integrated circuit 500). Thus, the first logic output OUTPUT 3 and the second logic output OUTPUT 4 are respective first and second functions of a same logic inputs (e.g., the fifth input INPUT 5 and the sixth input INPUT 6 for the integrated circuit 500) to the combined logic cell 550. The interconnections are configured to direct the first logic output OUTPUT 3 and the second logic output OUTPUT 4 to respective destinations outside the combined logic cell 550.

The first (NAND) transistors TR3 include first and second transistors of the combined logic cell 550. The first transistor (in this example, a fifth transistor for the integrated circuit 500) of the combined logic cell 550 includes a gate region G5 (with a gate width GW3), a first transistor source-drain region (in this example, a fifth transistor source-drain region SD5 for the integrated circuit 500), and the interconnections (some of which are designated 555) configured to implement the logic function. The second transistor (in this example, a sixth transistor for the integrated circuit 500) includes the gate region G6 (with the gate GW3), a second transistor source-drain region (in this example, a sixth transistor source-drain region SD6 for the integrated circuit 500), and the interconnections (some of which are designated 555) configured to implement the logic function.

The second (NOR) transistors TR4 include third and fourth transistors of the combined logic cell 550. The third transistor (in this example, a seventh transistor for the integrated circuit 500) of the combined logic cell 550 includes the gate region G5 (with the gate width GW3), a third transistor source-drain region (in this example, a seventh transistor source-drain region SD7 for the integrated circuit 500), and the interconnections (some of which are designated 555) configured to implement the logic function. The fourth transistor (in this example, an eighth transistor for the integrated circuit 500) includes the gate region G6 (with the gate width GW3), a fourth transistor source-drain region (in this example, an eighth transistor source-drain region SD8 for the integrated circuit 500), and the interconnections (some of which are designated 555) configured to implement the logic function.

While the gate region G5 is illustrated as a single structure that spans the fifth transistor source-drain region SD5, the sixth transistor source-drain region SD6, the seventh transistor source-drain region SD7 and the eighth transistor source-drain region SD8, the gate region G5 includes a gate over the fifth transistor source-drain region SD5 and a gate over the seventh transistor source-drain region SD7. Similarly, the gate width GW3 is also illustrated as a single overall dimension of the gate region G5 that includes a gate width for the gate over the fifth transistor source-drain region SD5 and a gate width for the gate over the seventh transistor source-drain region SD7.

While the gate region G6 is illustrated as a single structure that spans the fifth transistor source-drain region SD5, the sixth transistor source-drain region SD6, the seventh transistor source-drain region SD7 and the eighth transistor source-drain region SD8, the gate region G6 includes a gate over the sixth transistor source-drain region SD6 and a gate over the eighth transistor source-drain region SD8. Similarly, the gate width GW3 is also illustrated as a single overall dimension of the gate region G6 that includes a gate width for the gate over the sixth transistor source-drain region SD6 and a gate width for the gate over the eighth transistor source-drain region SD8.

The first (NAND) transistors TR3 (in this example, the fifth and sixth transistors for the integrated circuit 500) are configured to produce the first logic output OUTPUT 3 with a first output drive current capacity, and the second (NOR) transistors TR4 (in this example, the seventh and eighth transistors for the integrated circuit 500) are configured to produce the second logic output OUTPUT 4 with a second output drive current capacity different than the first output drive capacity. The transistors (in this example, the fifth, sixth, seventh and eighth transistors for the integrated circuit 500, or ones thereof) of the combined logic cell 550 may have a same or lower output drive current capacity than the transistors (in this example, the first, second, third and fourth transistors for the integrated circuit 500) of the first and second standard logic cells 510, 540 of the plurality of standard logic cells.

The transistors of each standard logic cell 510, 540 of the plurality of standard logic cells have first and second gate widths (in this example, the gate width GW1 for the first and second transistors for the integrated circuit 500, and the gate width GW2 for the third and fourth transistors for the integrated circuit 500). The transistors of the combined logic cell 550 configured to implement the corresponding first and second logic functions have a third gate width GW3. The third gate width GW3 is different than at least one of the first and second gate widths GW1, GW2. The first and second gate widths GW1, GW2 may be substantially equal, and the third gate width GW3 is different than the first and second gate widths GW1, GW2. While the gate widths in general may be the same or different, the cell height for the combined logic cell 550 and the first and second standard logic cell 510, 540 is the same while accommodating multiple logic functions.

Figure 6:
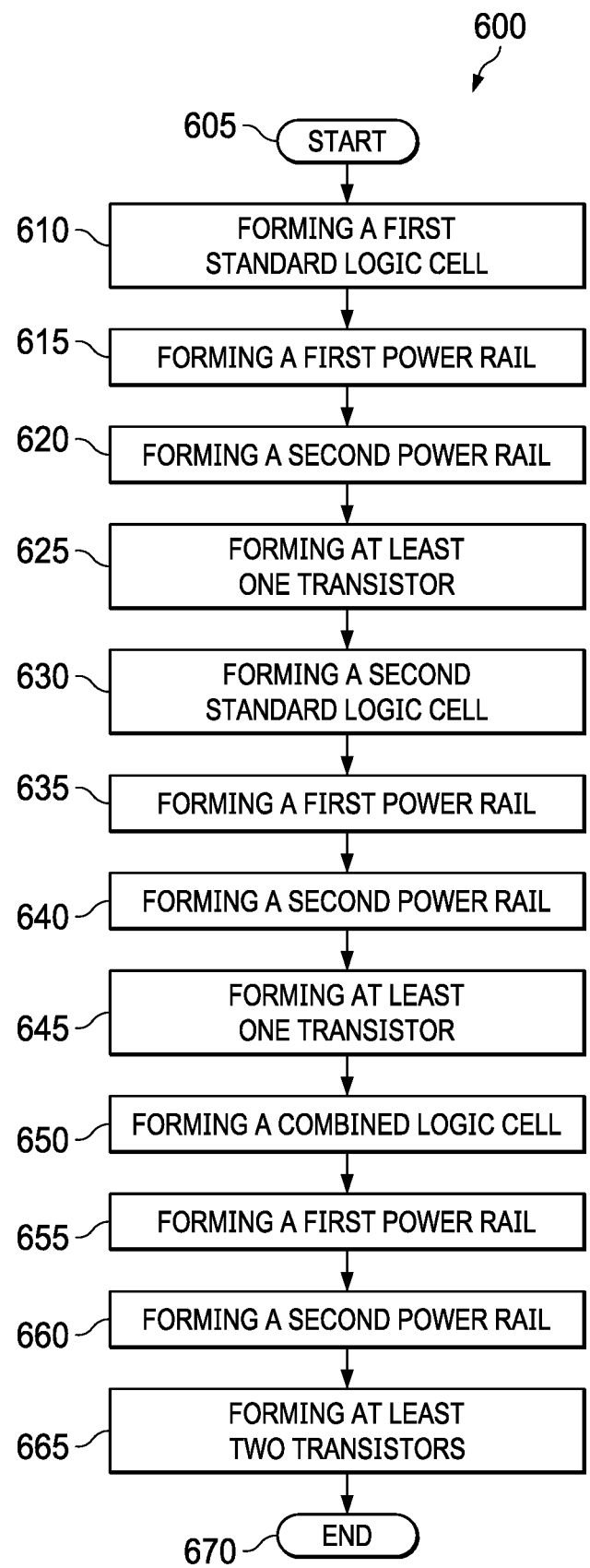
FIG. 6 illustrates a flow diagram of an example of a method of forming an integrated circuit.

Turning now to FIG. 6, illustrated is a flow diagram of an example of a method 600 of forming an integrated circuit. For purposes of example support, features introduced herein will refer back to like features (by reference number) described above with respect to the previous FIGUREs. Additionally, while the method 600 that follows describes forming a plurality of logic cells in separate steps, it should be understood that the plurality of logic cells may be formed concurrently. The method 600 of forming the integrated circuit (see, e.g., FIG. 2, 200; FIG. 3, 300; FIG. 4, 400; FIG. 5, 500) begins at a start step 605. At a step 610, the method 600 forms a first standard logic cell (see, e.g., FIG. 2, 210; FIG. 3, 310; FIG. 4, 410; FIG. 5, 510) over a semiconductor substrate (see, e.g., FIG. 2, 205; FIG. 3, 305; FIG. 4, 405; FIG. 5, 505) in rows. To form the first standard logic cell, the method 600 forms a first power rail (see, e.g., FIG. 2, 215; FIG. 3, 315; FIG. 4, 415; FIG. 5, 515) along one side (see, e.g., FIG. 2, 220; FIG. 3, 320; FIG. 4, 420; FIG. 5, 520) at a step 615. To form the first standard logic cell, the method 600 forms a second power rail (see, e.g., FIG. 2, 225; FIG. 3, 325; FIG. 4, 425; FIG. 5, 525) along a second opposite side (see, e.g., FIG. 2, 230; FIG. 3, 330; FIG. 4, 430; FIG. 5, 530) at a step 620. To form the first standard logic cell, the method 600 forms at least one transistor (see, e.g., FIG. 2, 235; FIG. 3, 335; FIGS. 4 and 5, TR1) and interconnections (see, e.g., FIG. 4, 432; FIG. 5, 532) configured to implement a logic function that when operated produces a single logic output (see, e.g., FIGS. 2-5, OUTPUT 1) of the first standard logic cell (see, e.g., FIG. 2, 210; FIG. 3, 310; FIG. 4, 410; FIG. 5, 510) at a step 625. The first standard logic cell (see, e.g., FIG. 2, 210; FIG. 3, 310; FIG. 4, 410; FIG. 5, 510) has a standard height (see, e.g., FIGS. 2-5, H), and a width that is an integer multiple of a unit width (see, e.g., FIGS. 2-5, UW).

At a step 630, the method 600 forms a second standard logic cell (see, e.g., FIG. 2, 240; FIG. 3, 340; FIG. 4, 440; FIG. 5, 540) over the semiconductor substrate (see, e.g., FIG. 2, 205; FIG. 3, 305; FIG. 4, 405; FIG. 5, 505) in rows. To form the second standard logic cell, the method 600 forms a first power rail (see, e.g., FIG. 2, 215; FIG. 3, 315; FIG. 4, 415; FIG. 5, 515) along one side (see, e.g., FIG. 2, 220; FIG. 3, 320; FIG. 4, 420; FIG. 5, 520) at a step 635. To form the second standard logic cell, the method 600 forms a second power rail (see, e.g., FIG. 2, 225; FIG. 3, 325; FIG. 4, 425; FIG. 5, 525) along a second opposite side (see, e.g., FIG. 2, 230; FIG. 3, 330; FIG. 4, 430; FIG. 5, 530) at a step 640. To form the second standard logic cell, the method 600 forms at least one transistor (see, e.g., FIG. 2, 245; FIG. 3, 345; FIGS. 4 and 5, TR2) and interconnections (see, e.g., FIG. 4, 445; FIG. 5, 545) configured to implement a logic function that when operated produces a single logic output (see, e.g., FIGS. 2-5, OUTPUT 2) of the second standard logic cell (see, e.g., FIG. 2, 240; FIG. 3, 340; FIG. 4, 440; FIG. 5, 540) at a step 645. The second standard logic cell (see, e.g., FIG. 2, 240; FIG. 3, 340; FIG. 4, 440; FIG. 5, 540) has the standard height (see, e.g., FIGS. 2-5, H), and a width that is an integer multiple of a unit width (see, e.g., FIGS. 2-5, UW).

At a step 650, the method 600 forms a combined logic cell (see, e.g., FIG. 2, 250; FIG. 3, 350; FIG. 4, 450; FIG. 5, 550) over the semiconductor substrate (see, e.g., FIG. 2, 205; FIG. 3, 305; FIG. 4, 405; FIG. 5, 505) in rows. To form the combined logic cell, the method 600 forms a first power rail (see, e.g., FIG. 2, 215; FIG. 3, 315; FIG. 4, 415; FIG. 5, 515) along one side (see, e.g., FIG. 2, 220; FIG. 3, 320; FIG. 4, 420; FIG. 5, 520) at a step 655. To form the combined logic cell, the method 600 forms a second power rail (see, e.g., FIG. 2, 225; FIG. 3, 325; FIG. 4, 425; FIG. 5, 525) along a second opposite side (see, e.g., FIG. 2, 230; FIG. 3, 330; FIG. 4, 430; FIG. 5, 530) at a step 660.

To form the combined logic cell, the method 600 forms at least two transistors (see, e.g., FIG. 2, 255, 260; FIG. 3, 355, 360; FIGS. 4 and 5, TR3, TR4) and interconnections (see, e.g., FIG. 4, 455; FIG. 5, 555) configured to implement a first logic function and a second logic function at a step 665. The first logic function may be a different logic function than the second logic function. The first logic function and the second logic function produce a first logic output (see, e.g., FIGS. 2-5, OUTPUT 3) and a second logic output (see, e.g., FIGS. 2-5, OUTPUT 4), respectively. The interconnections (see, e.g., FIG. 4, 455; FIG. 5, 555) configured to direct the first logic output (see, e.g., FIGS. 2-5, OUTPUT 3) and the second logic output (see, e.g., FIGS. 2-5, OUTPUT 4) to respective destinations outside the combined logic cell (see, e.g., FIG. 2, 250; FIG. 3, 350; FIG. 4, 450; FIG. 5, 550). The combined logic cell (see, e.g., FIG. 2, 250; FIG. 3, 350; FIG. 4, 450; FIG. 5, 550) has the standard height (see, e.g., FIGS.

2-5, H), and a width that is an integer multiple of a unit width (see, e.g., FIGS. 2-5, UW). The step 665 of forming the at least two transistors may include forming first and second transistors (see, e.g., FIG. 2, 255, 260; FIG. 3, 355, 360; FIGS. 4 and 5, TR3, TR4). The first transistor (see, e.g., FIG. 2, 255; FIG. 3, 355; FIGS. 4 and 5, TR3) configured to produce the first logic output (see, e.g., FIGS. 2-5, OUTPUT 3) with a first output drive current capacity, and the second transistor (see, e.g., FIG. 2, 260; FIG. 3, 360; FIGS. 4 and 5, TR4) configured to produce the second logic output (see, e.g., FIGUREs, OUTPUT 4) with a second output drive current capacity different than the first output drive capacity.

The following discussion introduced variations of forming the respective standard logic cells and combined logic cell. The first logic output (see, e.g., FIGS. 2-5, OUTPUT 3) and the second logic output (see, e.g., FIGS. 2-5, OUTPUT 4) may be respective first and second functions of a same logic input (see, e.g., FIG. 2, INPUT 4; FIG. 3, INPUT 5, INPUT 6; FIG. 4, INPUT 4; FIG. 5, INPUT 5, INPUT 6) to the combined logic cell (see, e.g., FIG. 2, 250; FIG. 3, 350; FIG. 4, 450; FIG. 5, 550). The first standard logic cell (see, e.g., FIG. 2, 210; FIG. 4, 410) and the second standard logic cell (see, e.g., FIG. 2, 240; FIG. 4, 440) have a width that is two or three integer units wide, and the combined logic cell (see, e.g., FIG. 2, 250; FIG. 4, 450) has a width that is three integer units wide. The first standard logic cell (see, e.g., FIG. 3, 310; FIG. 5, 510) and the second standard logic cell (see, e.g., FIG. 3, 340; FIG. 5, 540) have a width that is three integer units wide, and the combined logic cell (see, e.g., FIG. 3, 350; FIG. 5, 550) has a width that is four integer units wide.

The first logic function may be a two-input gate configured to receive the first logic input (see, e.g., FIGS. 2 and 4, INPUT 4) and a second different logic input (see, e.g., FIGS. 2 and 4, INPUT 5), and the second logic function may be an inverter configured to receive the first logic input (see, e.g., FIGS. 2 and 4, INPUT 4). The first standard logic cell (see, e.g., FIG. 2, 210; FIG. 4, 410) is configured to implement a first two-input gate and has a width that is three integer units wide, the second standard logic cell (see, e.g., FIG. 2, 240; FIG. 4, 440) is configured to implement a first inverter and has a width that is two integer units wide, and the combined logic cell (see, e.g., FIG. 2, 250; FIG. 4, 450) is configured to implement a second two-input gate and a second inverter and has a width that is three integer units wide. The first standard logic cell (see, e.g., FIG. 2, 210; FIG. 4, 410) uses a first die area (see, e.g., FIG. 2, 212; FIG. 4, 412) and is configured to implement a first NAND gate, the second standard logic cell (see, e.g., FIG. 2, 240; FIG. 4, 440) uses a second die area (see, e.g., FIG. 2, 242; FIG. 4, 442) and is configured to implement a first inverter, the combined logic cell (see, e.g., FIG. 2, 250; FIG. 4, 450) uses a third die area (see, e.g., FIG. 2, 252; FIG. 4, 452) and is configured to implement a second NAND gate and a second inverter. The third die area (see, e.g., FIG. 2, 252; FIG. 4, 452) is sixty percent or less than the sum of the first and second die areas (see, e.g., FIG. 2, 212, 242; FIG. 4, 412, 442).

The first logic function is a first two-input gate configured to receive a first logic input (see, e.g., FIGS. 3 and 5, INPUT 5) and a different second logic input (see, e.g., FIGS. 3 and 5, INPUT 6), and the second logic function is a second two-input gate configured to receive the first logic input see, e.g., FIGS. 3 and 5, INPUT 5) and the second logic input (see, e.g., FIGS. 3 and 5, INPUT 6). The first logic function is a first two-input gate configured to receive a first logic input (see, e.g., FIG. 3, INPUT 5) and a different second logic input (see, e.g., FIG. 3, INPUT 6), and the second logic function is a second two-input gate configured to receive the first logic input (see, e.g., FIG. 3, INPUT 5) and a third logic input (see, e.g., FIG. 3, INPUT 7) different from the first logic input (see, e.g., FIG. 3, INPUT 5) and the second logic input (see, e.g., FIG. 3, INPUT 6).

The first standard logic cell (see, e.g., FIG. 3, 310; FIG. 5, 510) is configured to implement a first NAND gate and has a width that is three integer units wide, the second standard logic cell (see, e.g., FIG. 3, 340; FIG. 5, 540) is configured to implement a first NOR gate and has a width that is three integer units wide, and the combined logic cell (see, e.g., FIG. 3, 350; FIG. 5, 550) is configured to implement a second NAND gate and a second NOR gate and has a width that is four integer units wide. The first standard logic cell (see, e.g., FIG. 3, 310; FIG. 5, 510) uses a first die area (see, e.g., FIG. 3, 312; FIG. 5, 512) and is configured to implement a first NAND gate, the second standard logic cell (see, e.g., FIG. 3, 340; FIG. 5, 540) uses a second die area (see, e.g., FIG. 3, 342; FIG. 5, 542) and is configured to implement a first NOR gate, and the combined logic cell (see, e.g., FIG. 3, 350; FIG. 5, 550) uses a third die area (see, e.g., FIG. 3, 352; FIG. 5, 552) and is configured to implement a second NAND gate and a second NOR gate. The third die area (see, e.g., FIG. 3, 352; FIG. 5, 552) is seventy percent or less than the sum of the first and second die areas (see, e.g., FIG. 3, 312, 342; FIG. 5, 512, 542).

The at least one transistor (see, e.g., FIGS. 4 and 5, TR1) of the first standard logic cell (see, e.g., FIG. 4, 410, FIG. 5, 510) has a first gate width (see, e.g., FIGS. 4 and 5, GW1), the at least one transistor (see, e.g., FIGS. 4 and 5, TR2) of the second standard logic cell (see, e.g., FIG. 4, 440, FIG. 5, 540) has a second gate width (see, e.g., FIGS. 4 and 5, GW2), the at least two transistors (see, e.g., FIGS. 4 and 5, TR3, TR4) of the combined logic cell (see, e.g., FIG. 4, 450, FIG. 5, 550) configured to implement the corresponding first and second logic functions have at least a third gate width (see, e.g., FIG. 4, GW3, GW4; FIG. 5, GW3), and the at least third gate width (see, e.g., FIG. 4, GW3, GW4; FIG. 5, GW3) being different than at least one of the first and second gate widths (see, e.g., FIGS. 4 and 5, GW1, GW2). The first and second gate widths (see, e.g., FIGS. 4 and 5, GW1, GW2) are substantially equal, and the at least third gate width (see, e.g., FIGS. 4 and 5, GW3, GW4; FIG. 5, GW3) being different than the first and second gate widths (see, e.g., FIGS. 4 and 5, GW1, GW2).

The combined NAND gate and Inverter Combined Logic Cell is summarized in Table 1.

TABLE 1

| Combined Logic Cell | Integer Unit Width |
| --- | --- |
| NAND Gate | 3 |
| Inverter | 2 |
| Separate Standard Logic Cells (NAND gate and Inverter) | 5 |
| Combined Logic Cell (NAND gate and Inverter) | 3 (40 percent less die area) |

The combined NAND gate and NOR gate Combined Logic Cell is summarized in Table 2.

TABLE 2

| Combined Logic Cell | Integer Unit Width |
| --- | --- |
| NAND Gate | 3 |
| NOR Gate | 3 |

TABLE 2-continued

| Combined Logic Cell | Integer Unit Width |
|---|---|
| Separate Standard Logic Cells (NAND gate and NOR Gate) | 6 |
| Combined Logic Cell NAND gate and NOR Gate) | 4 (33 percent less die area) |

Thus, an integrated circuit with standard logic cells and a combined logic cell, and related methods of operating and forming the same, has been introduced. It should be understood that the previously described examples of the integrated circuit, and related methods, are submitted for illustrative purposes only and that other examples capable of taking advantage of unused semiconductor die area to incorporate a plurality of logic functions into a combined logic cell are well within the broad scope of the present disclosure.

Although the present disclosure has been described in detail, various changes, substitutions and alterations may be made without departing from the spirit and scope of the disclosure in its broadest form.

Moreover, the scope of the present application is not intended to be limited to the particular examples of the process, machine, manufacture, composition of matter, means, methods and steps described in the specification. The processes, machines, manufacture, compositions of matter, means, methods, or steps, presently existing or later to be developed, that perform substantially the same function or achieve substantially the same result as the corresponding examples described herein may be utilized according to the present disclosure. Accordingly, the appended claims are intended to include within their scope such processes, machines, manufacture, compositions of matter, means, methods, or steps.

What is claimed is:

1. An integrated circuit, comprising:
   a plurality of logic cells arranged over a semiconductor substrate in rows, the logic cells including standard logic cells and at least one combined logic cell,
   each standard logic cell including:
     a standard height,
     a width that is an integer multiple of a unit width,
     a first power rail along one side,
     a second power rail along a second opposite side, and
     at least one transistor and interconnections configured to implement a logic function that when operated produces a single logic output of that standard logic cell; and
   the at least one combined logic cell including:
     the standard height,
     a width that is an integer multiple of the unit width,
     the first power rail along one side,
     the second power rail along a second opposite side, and
     at least two transistors and interconnections configured to implement a first logic function and a second logic function, the first logic function and the second logic function producing a first logic output and a second logic output, respectively, the interconnections configured to direct the first logic output and the second logic output to respective destinations outside the combined logic cell.

2. The integrated circuit as recited in claim 1, wherein the first logic output and the second logic output are respective first and second functions of a same logic input to the combined logic cell.

3. The integrated circuit as recited in claim 1, further comprising first and second transistors of the at least two transistors, the first transistor configured to produce the first logic output with a first output drive current capacity, and the second transistor configured to produce the second logic output with a second output drive current capacity different than the first output drive current capacity.

4. The integrated circuit as recited in claim 1, wherein the first logic function is a two-input gate configured to receive a first logic input and a second different logic input, and the second logic function is an inverter configured to receive the first logic input.

5. The integrated circuit as recited in claim 1, wherein the first logic function is a first two-input gate configured to receive a first logic input and a different second logic input, and the second logic function is a second two-input gate configured to receive the first logic input and a third logic input different from the first logic input and the second logic input.

6. The integrated circuit as recited in claim 1, wherein the first logic function is a first two-input gate configured to receive a first logic input and a different second logic input, and the second logic function is a second two-input gate configured to receive the first logic input and the second logic input.

7. The integrated circuit as recited in claim 1, wherein the first logic function is a different logic function than the second logic function.

8. The integrated circuit as recited in claim 1, wherein each of a first standard logic cell and a second standard logic cell of the standard logic cells has a width that is two or three integer units wide, and the combined logic cell has a width that is three integer units wide.

9. The integrated circuit as recited in claim 1, wherein each of a first standard logic cell and a second standard logic cell of the standard logic cells has a width that is three integer units wide, and the combined logic cell has a width that is four integer units wide.

10. The integrated circuit as recited in claim 1, wherein a first standard logic cell of the standard logic cells is configured to implement a first two-input gate and has a width that is three integer units wide, a second standard logic cell of the standard logic cells is configured to implement a first inverter and has a width that is two integer units wide, and the combined logic cell is configured to implement a second two-input gate and a second inverter and has a width that is three integer units wide.

11. A method of forming an integrated circuit, comprising:
   forming a plurality of logic cells over a semiconductor substrate in rows, the plurality of logic cells including standard logic cells and at least one combined logic cell,
   the standard logic cells each including:
     a first power rail along one side,
     a second power rail along a second opposite side,
     a standard height, and a width that is an integer multiple of a unit width, and
     at least one transistor and interconnections configured to implement a logic function that when operated produces a single logic output of that standard logic cell; and
   the combined logic cell including:
     the first power rail along one side,
     the second power rail along a second opposite side, and
     at least two transistors and interconnections configured to implement a first logic function and a second logic function, the first logic function and the second logic function producing a first logic output and a second logic output, respectively, the interconnections configured to direct the first logic output and the second logic output to respective destinations outside the combined logic cell, the combined logic cell having the standard height, and a width that is an integer multiple of the unit width.

12. The method as recited in claim 11, wherein the first logic output and the second logic output are respective first and second functions of a same logic input to the combined logic cell.

13. The method as recited in claim 11, wherein the at least two transistors includes first and second transistors, the first transistor configured to produce the first logic output with a first output drive current capacity, and the second transistor configured to produce the second logic output with a second output drive current capacity different than the first output drive current capacity.

14. The method as recited in claim 11, wherein the first logic function is a two-input gate configured to receive a first logic input and a second different logic input, and the second logic function is an inverter configured to receive the first logic input.

15. The method as recited in claim 11, wherein the first logic function is a first two-input gate configured to receive a first logic input and a different second logic input, and the second logic function is a second two-input gate configured to receive the first logic input and a third logic input different from the first logic input and the second logic input.

16. The method as recited in claim 11, wherein the first logic function is a first two-input gate configured to receive a first logic input and a different second logic input, and the second logic function is a second two-input gate configured to receive the first logic input and the second logic input.

17. The method as recited in claim 11, wherein the first logic function is a different logic function than the second logic function.

18. The method as recited in claim 11, wherein the standard logic cells have a width that is two or three integer units wide, and the combined logic cell has a width that is three integer units wide.

19. The method as recited in claim 11, wherein the standard logic cells have a width that is three integer units wide, and the combined logic cell has a width that is four integer units wide.

20. The method as recited in claim 11, wherein a first one of the standard logic cells is configured to implement a first two-input gate and has a width that is three integer units wide, a second one of the standard logic cells is configured to implement a first inverter and has a width that is two integer units wide, and the combined logic cell is configured to implement a second two-input gate and a second inverter and has a width that is three integer units wide.

* * * * *